(12) United States Patent
Williamson et al.

(10) Patent No.: US 7,892,978 B2
(45) Date of Patent: Feb. 22, 2011

(54) ELECTRON INDUCED CHEMICAL ETCHING FOR DEVICE LEVEL DIAGNOSIS

(75) Inventors: Mark J. Williamson, Boise, ID (US);
Gurtej S. Sandhu, Boise, ID (US);
Justin R. Arrington, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 596 days.

(21) Appl. No.: 11/483,878

(22) Filed: Jul. 10, 2006

(65) Prior Publication Data

US 2008/0009140 A1 Jan. 10, 2008

(51) Int. Cl.
*H01L 21/302* (2006.01)

(52) U.S. Cl. .................. 438/706; 438/689; 438/692; 438/710; 438/8; 438/3; 216/37; 216/58; 216/62; 216/104

(58) Field of Classification Search .............. 438/689, 438/692, 710, 3, 8; 216/37, 58, 62, 104
See application file for complete search history.

(56) References Cited

U.S. PATENT DOCUMENTS

| | | | |
|---|---|---|---|
| 4,260,649 | A | 4/1981 | Dension et al. |
| 4,543,486 | A | 9/1985 | Rose |
| 4,579,750 | A | 4/1986 | Bowen et al. |
| 4,581,248 | A | 4/1986 | Roche |
| 4,624,736 | A | 11/1986 | Gee et al. |
| 4,655,849 | A | 4/1987 | Schachameyer et al. |
| 4,668,304 | A | 5/1987 | Schachameyer et al. |
| 4,670,063 | A | 6/1987 | Schachameyer et al. |
| 4,670,064 | A | 6/1987 | Schachameyer et al. |
| 4,685,976 | A | 8/1987 | Schachameyer et al. |
| 4,694,777 | A | 9/1987 | Roche |

(Continued)

FOREIGN PATENT DOCUMENTS

EP 0756318 A1 1/1997

(Continued)

OTHER PUBLICATIONS

L. Wood, IEEE 2000 International Symposium on Electronic Materials & Packaging, pp. 406-408.*

(Continued)

*Primary Examiner*—Nadine G Norton
*Assistant Examiner*—Maki A Angadi
(74) *Attorney, Agent, or Firm*—Schwegman, Lundberg & Woessner, P.A.

(57) ABSTRACT

A method of imaging and identifying materials, contamination, fabrication errors, and defects on and below the surface of an integrated circuit (IC) is described. The method may be used in areas smaller than one micron in diameter, and may remove IC layers, either selectively or non-selectively, until a desired depth is obtained. An energetic beam, such as an electron beam, is directed at a selected IC location. The IC has a layer of a solid, fluid or gaseous reactive material, such as a directed stream of a fluorocarbon, formed over the surface of the IC. The energetic beam disassociates the reactive material in or on the region into chemical radicals that chemically attack the surface. The surface may be examined as various layers are selectively removed in the controlled area spot etch, and SEM imaging may then be used to diagnose problems.

29 Claims, 5 Drawing Sheets

U.S. PATENT DOCUMENTS

| | | |
|---|---|---|
| 4,832,781 A | 5/1989 | Mears |
| 4,933,206 A | 6/1990 | Cox |
| 4,938,996 A | 7/1990 | Ziv et al. |
| 4,940,505 A | 7/1990 | Schachameyer et al. |
| 4,980,198 A | 12/1990 | Dowben et al. |
| 5,032,435 A | 7/1991 | Biefeld et al. |
| 5,047,649 A | 9/1991 | Hodgson et al. |
| 5,102,830 A | 4/1992 | Sandhu |
| 5,140,164 A | 8/1992 | Talbot et al. |
| 5,155,053 A | 10/1992 | Atkinson |
| 5,164,222 A | 11/1992 | Gottsleben et al. |
| 5,326,981 A | 7/1994 | Hara et al. |
| 5,387,443 A | 2/1995 | Ota et al. |
| 5,403,433 A | 4/1995 | Morrison et al. |
| 5,429,730 A | 7/1995 | Nakamura et al. |
| 5,438,019 A | 8/1995 | Sandhu |
| 5,472,935 A | 12/1995 | Yandrofski et al. |
| 5,508,368 A | 4/1996 | Knapp et al. |
| 5,622,567 A | 4/1997 | Kojima et al. |
| 5,639,342 A | 6/1997 | Chen et al. |
| 5,641,545 A | 6/1997 | Sandhu |
| 5,648,114 A | 7/1997 | Paz De Araujo et al. |
| 5,682,041 A | 10/1997 | Kawakubo et al. |
| 5,733,609 A | 3/1998 | Wang |
| 5,754,297 A | 5/1998 | Nulman |
| 5,759,923 A | 6/1998 | McMillan et al. |
| 5,800,617 A | 9/1998 | Sandhu |
| 5,807,650 A | 9/1998 | Komano et al. |
| 5,825,035 A | 10/1998 | Mizumura et al. |
| 5,834,331 A | 11/1998 | Razeghi |
| 5,942,854 A | 8/1999 | Ryoji et al. |
| 5,976,328 A | 11/1999 | Azuma et al. |
| 5,985,693 A | 11/1999 | Leedy |
| 5,989,928 A | 11/1999 | Nakata et al. |
| 6,051,287 A | 4/2000 | Marsh |
| 6,064,800 A | 5/2000 | Sandhu |
| 6,091,071 A | 7/2000 | Franz et al. |
| 6,113,751 A | 9/2000 | Morgenthaler |
| 6,143,085 A | 11/2000 | Marsh |
| 6,177,147 B1 | 1/2001 | Samukawa et al. |
| 6,187,492 B1 | 2/2001 | Ri et al. |
| 6,194,325 B1 | 2/2001 | Yang et al. |
| 6,214,183 B1 | 4/2001 | Maishev et al. |
| 6,281,072 B1 | 8/2001 | Li et al. |
| 6,291,341 B1 | 9/2001 | Sharan et al. |
| 6,309,972 B1 | 10/2001 | Pio |
| 6,310,341 B1 | 10/2001 | Todokoro et al. |
| 6,462,333 B1 | 10/2002 | Gersonde |
| 6,499,425 B1 | 12/2002 | Sandhu et al. |
| 6,573,199 B2 | 6/2003 | Sandhu et al. |
| 6,613,702 B2 | 9/2003 | Sandhu et al. |
| 6,661,005 B1 | 12/2003 | Bruenger |
| 6,683,005 B2 | 1/2004 | Sandhu et al. |
| 6,720,272 B2 | 4/2004 | Sandhu et al. |
| 6,730,367 B2 | 5/2004 | Sandhu |
| 6,753,538 B2 | 6/2004 | Musil et al. |
| 6,764,856 B2 | 7/2004 | Holmes et al. |
| 6,787,783 B2 * | 9/2004 | Marchman et al. ....... 250/492.2 |
| 6,793,736 B2 | 9/2004 | Sandhu et al. |
| 6,797,337 B2 | 9/2004 | Dando et al. |
| 6,809,317 B2 | 10/2004 | Vandervorst |
| 6,811,615 B2 | 11/2004 | Sun |
| 6,838,114 B2 | 1/2005 | Carpenter et al. |
| 6,838,121 B2 | 1/2005 | Weimer |
| 6,845,734 B2 | 1/2005 | Carpenter et al. |
| 6,869,479 B2 | 3/2005 | Shafeev et al. |
| 6,897,907 B2 | 5/2005 | Morimitsu |
| 6,911,832 B2 | 6/2005 | Kolachina et al. |
| 7,113,276 B1 | 9/2006 | Higgs et al. |
| 7,122,125 B2 | 10/2006 | Deshmukh et al. |
| 7,238,294 B2 | 7/2007 | Koops et al. |
| 7,256,405 B2 | 8/2007 | Nakasuji et al. |
| 7,262,555 B2 | 8/2007 | Rueger et al. |
| 7,303,690 B2 | 12/2007 | Amemiya et al. |
| 7,311,947 B2 | 12/2007 | Dando et al. |
| 7,452,477 B2 | 11/2008 | Koops et al. |
| 7,569,484 B2 | 8/2009 | Rueger et al. |
| 7,718,080 B2 | 5/2010 | Rueger et al. |
| 7,791,055 B2 | 9/2010 | Williamson et al. |
| 7,791,071 B2 | 9/2010 | Rueger et al. |
| 7,807,062 B2 | 10/2010 | Williamson et al. |
| 2002/0173124 A1 | 11/2002 | Joo |
| 2002/0182542 A1 | 12/2002 | Choi et al. |
| 2003/0047691 A1 | 3/2003 | Musil et al. |
| 2003/0170389 A1 | 9/2003 | Sandhu |
| 2003/0201391 A1 | 10/2003 | Shinada et al. |
| 2004/0036398 A1 | 2/2004 | Jin |
| 2004/0048398 A1* | 3/2004 | Liang et al. .................... 438/3 |
| 2004/0091638 A1 | 5/2004 | Haight et al. |
| 2004/0097076 A1 | 5/2004 | Iyer et al. |
| 2004/0113097 A1 | 6/2004 | Marchman et al. |
| 2004/0124348 A1 | 7/2004 | Utz et al. |
| 2004/0140437 A1 | 7/2004 | Bukofsky et al. |
| 2004/0151991 A1 | 8/2004 | Stewart et al. |
| 2005/0078462 A1 | 4/2005 | Dando et al. |
| 2005/0087514 A1 | 4/2005 | Koops et al. |
| 2005/0212092 A1 | 9/2005 | Nishizawa |
| 2005/0253093 A1 | 11/2005 | Gorski et al. |
| 2005/0266168 A1 | 12/2005 | Poullos |
| 2006/0134920 A1* | 6/2006 | Liang ......................... 438/710 |
| 2006/0147814 A1 | 7/2006 | Liang |
| 2006/0154477 A1 | 7/2006 | Geng et al. |
| 2006/0183055 A1 | 8/2006 | O'Neill et al. |
| 2006/0201911 A1 | 9/2006 | Edelberg et al. |
| 2006/0228634 A1 | 10/2006 | Bret et al. |
| 2006/0288937 A1 | 12/2006 | Dando et al. |
| 2006/0289969 A1 | 12/2006 | Dando et al. |
| 2007/0158303 A1 | 7/2007 | Nasser-Ghodsi et al. |
| 2007/0158304 A1 | 7/2007 | Nasser-Ghodsi et al. |
| 2007/0228002 A1 | 10/2007 | Geng et al. |
| 2007/0228296 A1 | 10/2007 | Mouttet |
| 2007/0257212 A1 | 11/2007 | Mouttet |
| 2007/0278180 A1 | 12/2007 | Williamson et al. |
| 2008/0006603 A1 | 1/2008 | Williamson et al. |
| 2008/0006786 A1 | 1/2008 | Williamson et al. |
| 2008/0038863 A1 | 2/2008 | Rueger et al. |
| 2008/0038894 A1 | 2/2008 | Rueger et al. |
| 2008/0038928 A1 | 2/2008 | Rueger et al. |
| 2008/0038933 A1 | 2/2008 | Rueger et al. |
| 2009/0288603 A1 | 11/2009 | Rueger et al. |
| 2010/0221922 A1 | 9/2010 | Rueger et al. |

FOREIGN PATENT DOCUMENTS

| | | |
|---|---|---|
| JP | 09064030 A2 | 3/1997 |
| JP | 2004-257845 | 9/2004 |
| WO | WO-2008008156 A3 | 1/2008 |
| WO | WO-2008008157 A2 | 1/2008 |
| WO | WO-2008008157 A3 | 1/2008 |
| WO | WO-2008008159 A2 | 1/2008 |
| WO | WO-2008008159 A3 | 1/2008 |
| WO | WO-2008021363 A2 | 2/2008 |
| WO | WO-2008021363 A3 | 2/2008 |

OTHER PUBLICATIONS

M. Golub, Jounral of Materials Science, vol. 36, pp. 5543-5550, (2001).*

G. Alers, IEEE Transactions on Device and Materials Reliability, vol. 4, pp. 148-152, (2004).*

"Search Report", *International Application No. PCT/US2007/014375*, 4 pgs.

"Written Opinion", *International Application No. PCT/US2007/014375*, 8 pgs.

Numajiri, T., et al., "Sample Preparation for electron beam testing with reactive ion etching", *Physical and Failure Analysis of Integrated circuits,1997, Proceedings of the 1997 6th International Symposium on Singapore Jul. 21-25, 1997, New york, USA*, (Jul. 21, 1997),56-61 pgs.

Abramo, M., et al., "Gas Assisted Etching: An Advanced Technique for Focused Ion Beam Device Modification", Proceedings of the International Symposium for Testing Failure Analysis, (Nov. 13, 1994), 439-446 pgs.

Abramo, M. T, et al., "The application of advanced techniques for complex focused-ion-beam device modification", Reliability of electron devices, failure physics and analysis, 1996. Proceedings of the 7th europeon symposium on Oct. 8-11, 1996, Piscataway, NJ, USA, IEEE, (Oct. 8, 1996), 1775-1778 pgs.

Fujii, Toshiaki, et al., "A nanofactory by focused ion beam", Journal of Micromechanics and Microengineering, 15(10), (2005), S286-S291.

Fujioka, H., et al., "Measurements of the Energy Dependence of Electron Beam Assisted Etching of, and Deposition on, Silica", Journal of Physics D. Applied Physics, IOP Publishing, Bristol, GB, vol. 23, No. 2, (Feb. 14, 1990), 266-268 pgs.

Jonge, N., et al., "High brightness electron beam from a multi-walled carbon nanotube", Nature vol. 420, (Nov. 28, 2002), 393-395.

Liao, J. Y, et al., "Etch characterization of packaged IC samples in an RIE with endpoint detection by ICP source for failure analysis applications", Physical and failure analysis of integrated circuits, 2005, IPFA 2005. Proceedings of the 12th International Symposium on the Shangri-LA's RASA Sentosa Resort, Singapore Jun. 27-Jul. 1, 2005 Piscataway, NJ, USA, IEEE, (Jun. 27, 2005), 123-126 pgs.

Marcoux, P. J, et al., "Methods of end point detection for plasma etching", Solid State Technology, Pennwell Corporation, Tulsa, OK, US, vol. 25, (Apr. 1981), 115-122 pgs.

Randolph, S., et al., "Focused electron-beam-induced etching of silicon dioxide", Journal of Applied Physics, American Institute of Physics, 98, (Aug. 3, 2005), 34902-34902.

Sanchez, E. J, et al., "Ion and electron beam assisted growth of nanometric sl m on structures for near-field microscopy", Review of scientific instruments, AIP, Melville, NY, US, vol. 73, No. 11, (Nov. 2002), 3901-3907 pgs.

Teo, K., et al., "Fabrication and Electrical Characteristics of carbon nanotube-based microcathodes for use in a parallel elecron-beam lithography system", Journal of Vacuum Science & Technology B: Microelectronics Processing and Phenomena, vol. 21, (Mar. 2003), 693-697.

Wang, J, et al., "Etching characteristics of chromium thin films by an electron beam induced surface reaction", Semicond. Sci. Technol., 18, (2003), 199-205.

\* cited by examiner

ELECTRON INDUCED CHEMICAL ETCHING FOR DEVICE LEVEL DIAGNOSIS

TECHNICAL FIELD

This application relates generally to semiconductor devices and device testing and, more particularly, to analysis of manufacturing defects and errors associated with electrical function failure and long term reliability failure in integrated circuit (IC) devices, which may be individual die, packaged die or die still on semiconductor wafers, such as memory devices, logic devices and microprocessors.

BACKGROUND

The semiconductor device industry has a market driven need to reduce IC device failures at electrical test, and to improve the operational lifetimes of IC devices. Reduced device failures may result in increased IC fabrication yield and improved device operational lifetime. Increased IC fabrication yields may result in decreased IC prices, and improved market share.

One method to reduce the number of device failures is to analyze failed devices and determine the cause of the failure. The failures may be what are known as field failures that occur at customer sites, or they may occur in products that have been sold to consumers. The failures may be found during wafer level testing at the end of wafer fabrication, or in testing after a supposedly good IC die is placed in a package, or in testing after a supposedly good IC package is placed in a printed circuit board (PCB).

It is known to examine failed devices by means of electrical testing, optical microscopes, transmitting electron microscopes (TEM), scanning electron microscopes (SEM), focused ion beams (FIB), and other well known methods. If, for example, a particle is found that produces a short between two conductive lines in a signal layer, then action may be taken at the fabrication site to reduce particle levels, and thus increase fabrication yield. This method may be used in cases where the failure, such as the illustrative particle just discussed, is at, or near, the surface of the sample, since the failure may not be otherwise visible in an optical or an electron microscope.

If the cause of the device failure is not on the surface of the sample, it is known to cut or fracture the device at a location near the suspected failure site, set the fracture surface in a holding mechanism, such as epoxy, and grind or polish the exposed lateral edge down to approximately the failure location. The location beneath the device surface may then be seen in cross section by SEM or optical microscope, and the nature of the defect may be observed.

Another method to reduce the number of device failures is to examine test structures fabricated alongside the production semiconductor wafers to determine if each production step has been completed within the specified tolerances. These tests may be electrical or physical, and may be destructive tests, such as physically measuring the amount of pressure required to pull a metal layer off of the surface. It is also known to make such destructive tests on small portions of production wafers, such as by using the non-functional area between IC die, which may be known as scribe lines or streets, to form the test structures. However, such tests may not accurately reflect the actual situation on the production IC die, since the scribe lines may not be treated exactly the same as the IC die, for example in not having the same area density of dielectric as a real circuit area.

Another method of testing to determine if each production operation has results that are within the specified range, is to deconstruct or reverse process a small area on a production IC die. For example, it is known to remove the top layers of an IC device by means of what may be known as a spot etch, in which a small elastomeric ring formed of a chemically resistant material is pressed onto the surface of the IC in the area of the suspected defect and serves to hold an etching solution designed to selectively remove some or all of the top layers of the structure and expose potential defects. For example, it is possible to use a chemical solution that preferentially attacks oxide layers to remove the passivation oxide over a polysilicon structure, and determine by SEM examination if a non-oxide dielectric layer under the polysilicon has been properly etched. However, the size of the elastomeric ring is very large as compared to the dimensions of typical IC structures, and may be larger than 2 mm in diameter, and thus produces a relatively large hole in the IC device. Further, there is no method to image the surface during the material removal process to determine if the lateral positioning is correct, or to determine if the depth of the material removal has reached the desired location. Thus, the spot etch, or deconstruction etching, must be done using timed etches and assumed or estimated etch rates. The use of liquid etch materials also limits the size of the hole that may be etched, since very small holes may have problems with reactant exchange with the bulk of the etch media, reactant depletion, and surface wetting problems including bubble formation. Such wetting, depletion, and other etch initiation problems, also contribute to the variability in etch depth.

It is known to etch small diameter holes of several microns in diameter in IC surfaces by means of what may be known as ion milling, using focused ion beams of such heavy ions as gallium. It is possible to analyze the material being etched by examining the atoms in the exhaust gas, typically using optical emission, atomic absorption, infrared, Raman, or mass spectroscopy. However, ion milling is generally not selective etching of materials, such as oxide over metal or polysilicon as in the previously discussed example. Such selective etch rates may be referred to as having an etch ratio. Ion milling may be compared to the use of a drill, cutting everything in its path relatively equally versus the high selectivity available with the chemical spot etching discussed above.

A method is needed to chemically etch a small area with high selectivity between different material etch rates, and the ability to observe the etching. The ability to analyze the composition of the material being etched would also be beneficial in determining the cause of a failure. With such an arrangement, the sample may be imaged during the small spot etching, and the etching may continue until the desired structure is completely exposed and ready for testing. Further, analysis of materials that may appear unexpectedly during the progress of etching may also be performed.

BRIEF DESCRIPTION OF THE DRAWINGS

The abovementioned issues are addressed by the present disclosure and will be understood by reading and studying the following specification, of which the Figures are a part.

DETAILED DESCRIPTION

Figure 1:
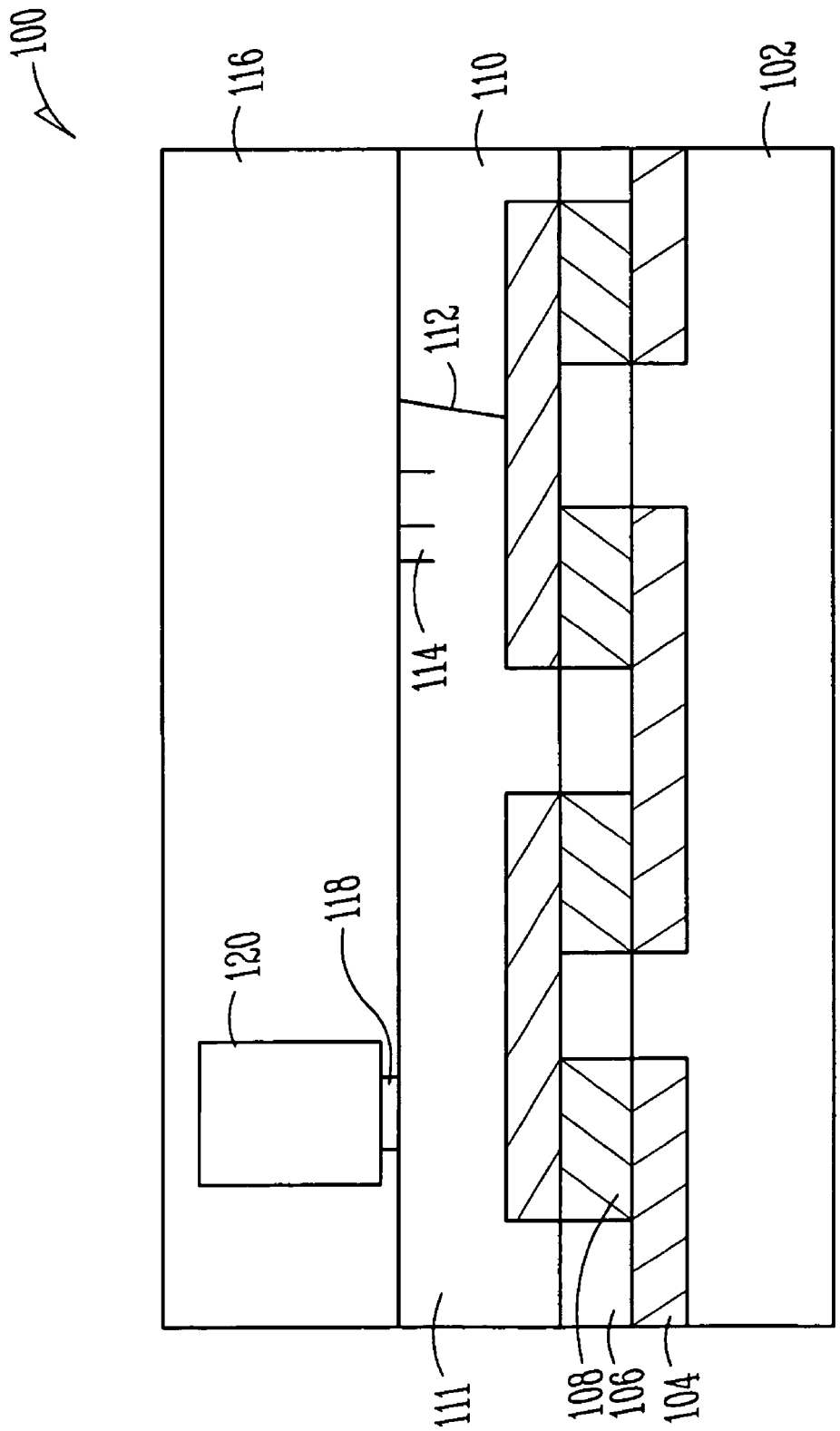
FIG. 1 illustrates a semiconductor device seen in cross section.

The following detailed description refers to the accompanying drawings that show, by way of illustration, specific aspects and embodiments in which the present disclosure may be practiced. These embodiments are described in sufficient detail to enable those skilled in the art to practice the present disclosure. Other embodiments may be utilized and structural, logical, and electrical changes may be made without departing from the scope of the present disclosure. The various embodiments are not necessarily mutually exclusive, as some embodiments can be combined with one or more other embodiments to form new embodiments.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present disclosure is defined only by the appended claims, along with the full scope of equivalents to which such claims are entitled.

The disclosed embodiments provide a method for localized selective chemical etching of an integrated circuit (IC) in preparation for testing and problem diagnosis. In an embodiment, the localized selectivity accelerator is an electron beam, and the excited material is a halogen containing compound forming a layer on, or immediately above, the surface of the IC in a vacuum chamber, such as inside a scanning electron microscope (SEM). Localized electron beam assisted chemical etching provides a method of localized materials characterization, such as may be useful in IC failure analysis. This method allows for selective and/or sequential etching of various layers, and may be compared to what is known in the art as spot etching. It is also possible to use the described method to selectively deposit materials locally, for example, in the etched hole. For example, a one micron diameter hole may be etched through several different material layers of an IC chip, and an unopened contact may be probed, or perhaps etched open by the use of appropriate etch compounds. The hole may then be filled with a conductive material and a dielectric material using the electron beam method to create radicals of silane and oxygen to form a silicon oxide dielectric layer in the hole. The "repaired" device may then be removed from the system and electrically function tested to determine if the contact was the sole cause of the observed failure.

IC structure characterization and diagnosis may occur, in an illustrative embodiment, by passing a gas phase halogen containing material over the surface of the IC chip in the vacuum chamber, and exciting the halogen atoms with an electron beam to form chemical radicals. By controlling the vacuum pressure and the gas flow, the mean free diffusion length of the radicals may be controlled, and the etching of the IC surface may be confined to a desired region around the electron beam. Electrons from the primary beam, electrons scattered from the IC surface, as well as secondary electrons from the IC surface may all cause the formation of the halogen radicals by dissociating the individual atoms of the halogen containing layer. The halogen containing layer may be adsorbed onto the surface of the IC, as may occur when using a base material such as xenon difluoride, which sublimates in a vacuum and may deposit on the surface of the IC.

The radicals may selectively, or non-selectively, etch portions of the IC surface, depending upon the selected combination of chemicals, and the etch products may be removed from the surface of the IC by the vacuum system pump. The removed materials may then be analyzed by a variety of down stream systems, such as a residual gas analyzer (RGA), to provide material characterization or to indicate that a specific layer has been substantially completely etched. The characterization may be done continuously until a desired depth is reached in the IC surface, or may be done at selected intervals, or when an interesting item is observed in the SEM view. This method provides a combination of chemical and spatial information as a function of depth while removing layers of the IC, which may be known as deprocessing.

FIG. 1 illustrates a semiconductor device 100, having a substrate 102, with a series of conductive regions 104. The conductive regions 104 may be formed from diffused portions of the substrate 102, from doped polysilicon, or from various metals and metal silicides. The conductors 104 are covered with a dielectric layer 106, having conductor filled contacts 108. The contacts 108 connect the conductive regions 104 to conductive regions 110, to form device signal and power interconnections, a contact test chain, or other structure. The various conductive materials may be pure materials or combinations of materials, such as copper doped aluminum, or may be formed of multiple layers, such as titanium tungsten barrier layers under each of the conductors 110. The conductors 110 are protected from environmental problems such as scratches and ionic contamination by a dielectric layer 111, which may be planarized to improve the topography for layers above the dielectric layer. One known method of planarizing a dielectric layer is chemical mechanical polishing (CMP). The dielectric layer 111 may have a different thermal coefficient of expansion (TCE or CTE) compared to the substrate 102, and thermal stress cracks 112 may occur. Cracks 112 may be a reliability issue since contaminants may travel into the semiconductor device via the crack. The use of CMP planarization may cause surface scratches 114, which may be difficult to distinguish from cracks 112, but may not be a serious reliability or yield problem. The method described herein may allow diagnosis of the potential problem as either a crack 112, a simple CMP scratch 114, by allowing the dielectric 111 to be observed as the region around the crack 112 or scratches 114 is locally etched. In an embodiment, the hole in the dielectric 111 etched by the described method may then be refilled by local dielectric deposition, for example using oxygen gas and silane gas exposed to the energetic beam, such as an electron beam.

The dielectric layer 111 is covered in the illustrated embodiment with another dielectric layer 116, having a structure 118 and 120 embedded therein. Examples of such structures may be a multilayered capacitor 120 connected to the rest of a circuit fabricated on substrate 102 by an electrically conductive material 118, which may be a titanium tungsten layer, or a doped polysilicon layer among many possible conductive material choices. The reliability of the illustrative capacitor 120 may depend upon how well it adheres to the layer 118, which may be affected by many factors, including whether the layer 118 has been excessively undercut during processing, as shown in the figure. The present method provides a method of removing the dielectric layer 116, so that testing of the capacitor 120 may be performed. Examples of tests that may be desired include shear strength tests and vibration resistance tests which check to see if any of the structures 120 topple.

Figure 2:
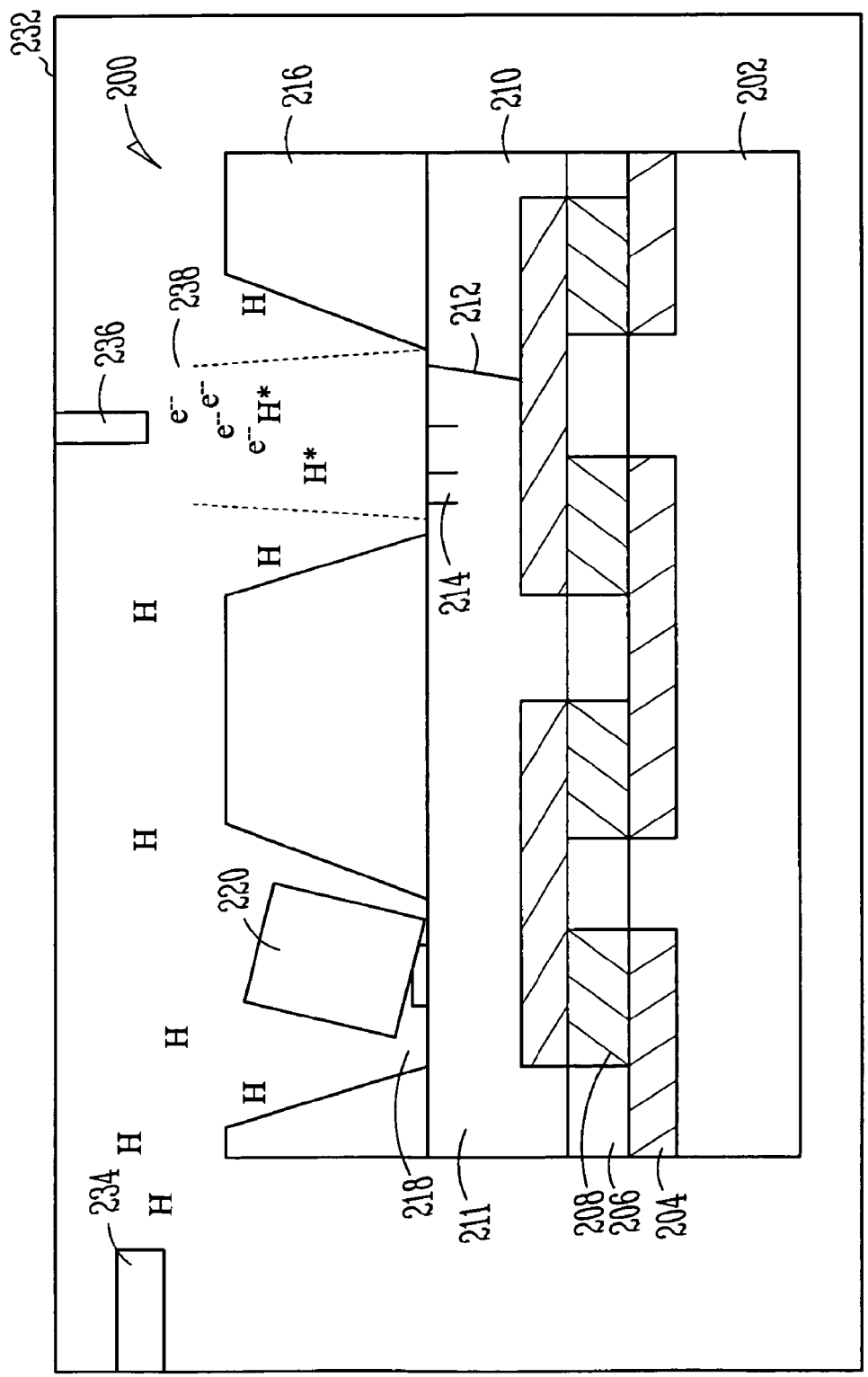
FIG. 2 illustrates the semiconductor device of FIG. 1 in a vacuum chamber and locally etched in accordance with an illustrative embodiment.

FIG. 2 illustrates the semiconductor device of FIG. 1 in a vacuum chamber 232, in an embodiment, a SEM, having a vacuum pump (not shown for simplicity), an inlet 234, and an energetic beam 236, such as an electron beam, which may be movable. The inlet 234 may be a directed gas jet as shown, or a sublimation port, a gas shower head, or a liquid material sprayer, such as an atomizer. The inlet 234 supplies the region around the top surface of the sample with a material that is either reactive, or may be made reactive, such as a halogen containing material. The atoms of the halogen in this illustrative example are shown as floating "H" symbols, some of which are adsorbed onto the surface of the sample, and some diffusing around the chamber 232.

The vacuum chamber 232 has a directed and focused energetic beam device 236, which in an embodiment is a SEM beam, directed to a desired location on the surface of the sample. The electron beam device 236 emits electrons 238 (shown as "e$^-$" symbols) which excite the halogen molecules or atoms (H) floating in the vacuum chamber 232, or adsorbed onto the surface of the sample, and form a chemically reactive radical, denoted by "H*". Due to short radical lifetime, the radicals are limited to the area around the electron beam 236 shown by the dotted lines. The selected radicals H* have a much greater chemical etch rate on the dielectric layer 216, than the halogen molecules or atoms (H), and thus the etching of the two shown pits occurs wherever the illustrative electron beam forms the H radicals. In an illustrative embodiment, the halogen compound is xenon difluoride, which forms fluorine radicals when excited by the electron beam. The fluorine radicals have a large etch rate on the top dielectric layer 216, but does not rapidly etch conductive materials such as 220 and 218. In this example, the etching is said to be selective for dielectrics over conductive materials. In such a fashion, it is possible to etch pits in the dielectric 216 to examine the crack 212 and scratches 214, or to remove the dielectric 216 from around the illustrative capacitor 220, which is shown as having poor adherence to the contact 218, and thus toppled during a vibration or turbulence test.

Figure 3:
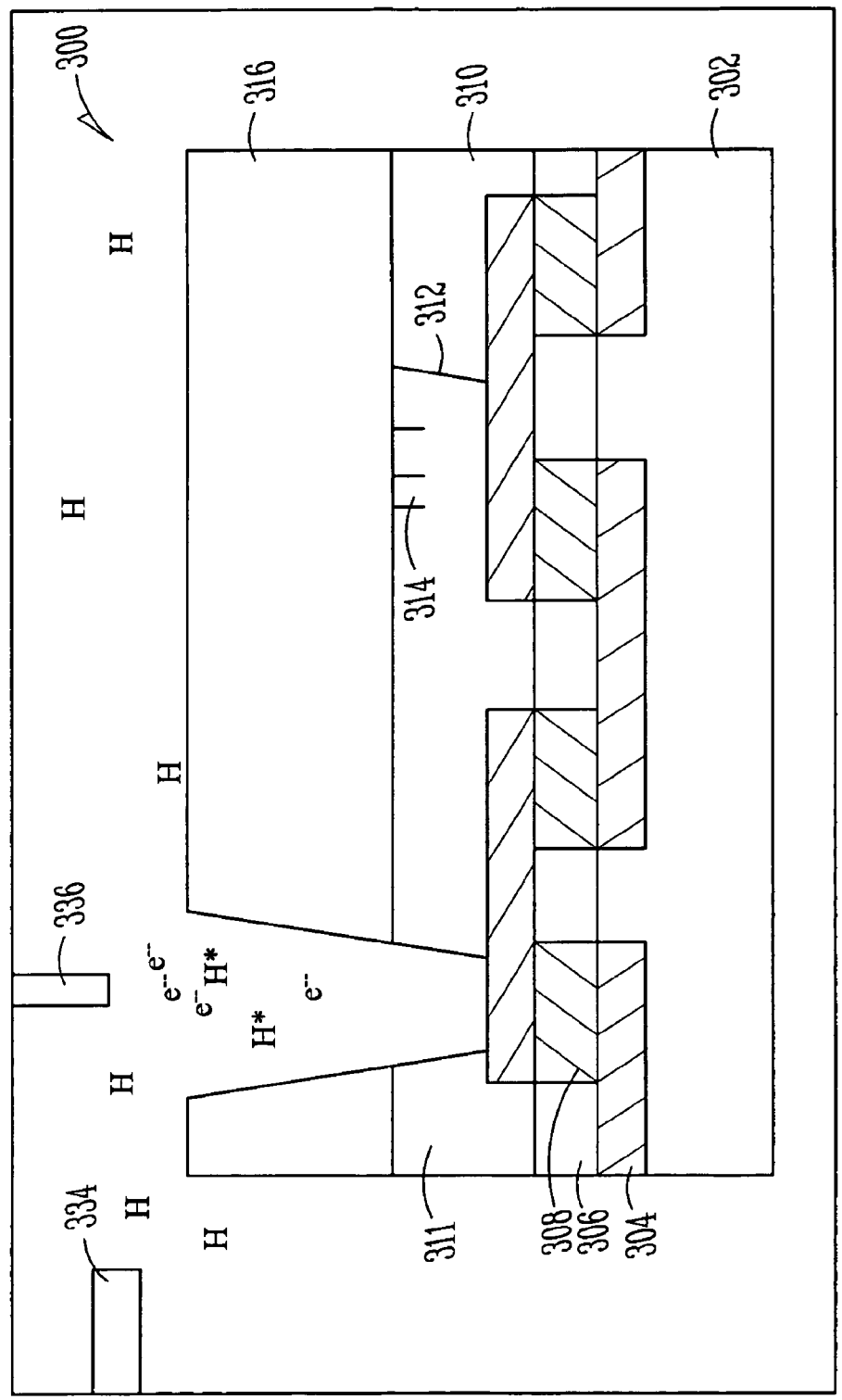
FIG. 3 illustrates the semiconductor device of FIG. 1, after a period of etching has occurred in another illustrative embodiment.

FIG. 3 illustrates another illustrative embodiment of the device of FIG. 1, after a period of etching of the dielectric layers 316 and 311 above the conductive lines 310 has passed. In this illustrative embodiment, the capacitor shown in FIG. 1 is at a different location than the etched location shown. The material being removed may be analyzed by any of the down stream methods previously discussed, such as RGA, in order to determine when the etch surface has reached the conductive material 310. In addition, the etch stop upon reaching the conductive material 310 may be determined directly using the SEM.

In this illustrative embodiment, the potential problem to be diagnosed is the electrical continuity of the illustrated contact chain made of conductive materials 304, 308 and 310. Once the hole has been etched to contact the conductive material 310, it may be probed by making physical contact with a test probe, but it may be seen that the etched hole may only be one micron in diameter, and no physical probe can reliably reach into such a small opening. In an embodiment, the exposed conductor 310 is electrically charged by the shown electron beam 236, and the continuity is observed by use of the voltage contrast mode of the SEM. In such a fashion, it is possible to determine if a contact chain has a defect such as an open circuit caused by an inadequately etched contact, or if there is a large voltage drop at a specific location in the contact chain. It may also be possible for the device to be repaired by building up a sufficient voltage to rupture the unopened contact. Such a procedure may have reliability risks, such as time dependent dielectric breakdown of transistor gate dielectrics that may be connected in some fashion to the contact chain.

In an embodiment, the etch pit is locally refilled by changing the material injected into the vacuum chamber 332 by the injector 334 to include a dielectric deposition gas mixture, such as silane and oxygen, which may react rapidly in the presence of the electron beam from device 336, and preferentially grow a dielectric layer in the hole over the conductor 310. The repaired device may be removed from the vacuum chamber 332, and electrically function tested in any common method, to determine if the device may be operated normally.

Figure 4:
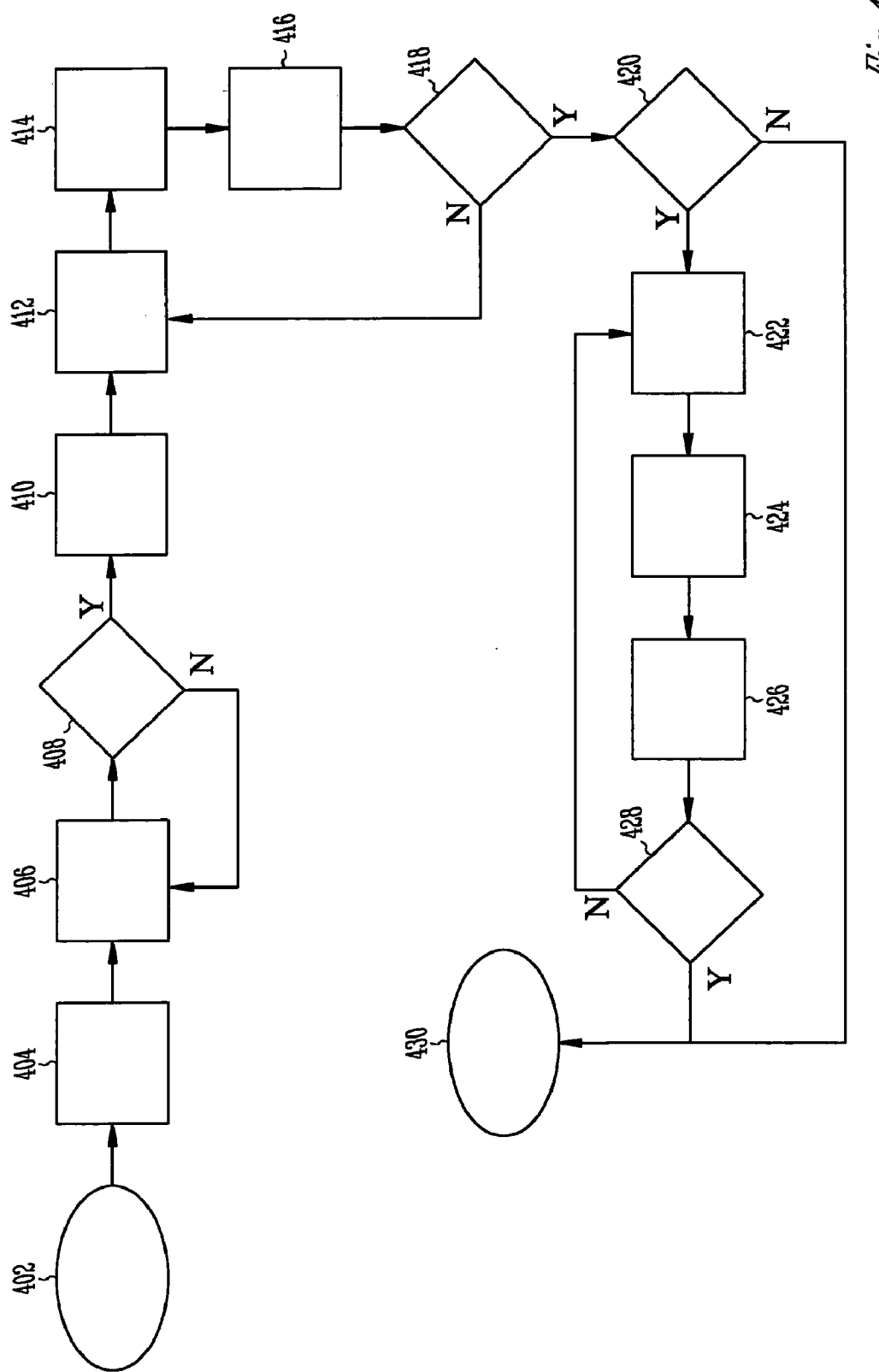
FIG. 4 is a flowchart of the method in accordance with an illustrative embodiment.

FIG. 4 is a flow diagram showing the method for electron induced chemical etching for device level diagnosis of potential problems. The method starts at 402 with obtaining a sample, such as an IC, for deconstruction. At 404 the sample is placed in a vacuum chamber, such as a SEM, and the chamber begins to be evacuated at 406. At 408 it is decided whether or not the chamber has been pumped to a desired vacuum pressure, which may be used to control the mean free path of the radicals generated by the electron beam. If the desired pressure is not yet obtained, the method returns to 406. When the proper vacuum level is reached the method uses a beam locator device, such as a SEM, to find the desired location at 410. At 412, the reactive material is injected into the vacuum chamber at a controlled rate, which in conjunction with the control of the vacuum pressure and the beam energy and intensity, may determine the production rate of the chemical radicals. The electron beam is turned on at a desired energy and beam intensity at 414, which depending upon the selected reactive material composition and pressure begins the chemical etching of at least some portion of the sample surface towards which the electron beam is directed. The reaction products are removed by the vacuum system.

At 416, the surface is examined by imaging the etch region with a SEM, and determining if the desired IC layer location has been reached. An endpoint to the etching may be directly observable by a SEM, or the reaction products may be analyzed by any of a variety of down stream analytic methods, such as RGA, to determine if the material being etched has been substantially removed. The exposed surface may also be analyzed by SEM based analysis methods, such as EDAX or XES to determine if the desired location, such as the conductive layer 310 of FIG. 3. At 418 it is determined whether the current material has been etched sufficiently. If not the method returns to 412 until the current layer has been etched to a desired depth.

If the current layer etching and analysis has been completed, then it is determined at 420 if there is an additional layer that needs to be etched, or whether there is to be a localized deposition done to fill the etched hole. If not, the method ends at 430, and the diagnostic testing may begin.

If there is another process to complete prior to ending the method, then a new reactive material may be injected into the vacuum chamber at 422, the electron beam is turned on to the desired energy level and intensity at 424, the etching maybe observed and the surface analyzed, and the etch result is analyzed at 426 as previously done at 416. At 428, it is determined if the present layer has been fully etched or deposited. If not, the method returns to 422. If the layer etch is completed, the method ends at 430.

Figure 5:
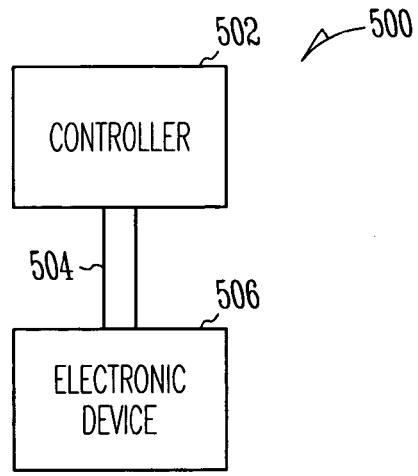
FIG. 5 is a block diagram of an electronic device in accordance with an embodiment of the invention.

FIG. 5 is a block diagram of a general electronic device in accordance with an embodiment of the invention with an electronic system 500 having one or more devices failure analyzed and tested and/or repaired according to various embodiments of the present invention. Electronic system 500 includes a controller 502, a bus 504, and an electronic device 506, where bus 504 provides electrical conductivity between controller 502 and electronic device 506. In various embodiments, controller 502 and/or electronic device 506 include an embodiment for a portion of the device having an IC die characterized and/or repaired as previously discussed herein. Electronic system 500 may include, but is not limited to, information handling devices, wireless systems, telecommunication systems, fiber optic systems, electro-optic systems, and computers.

Figure 6:
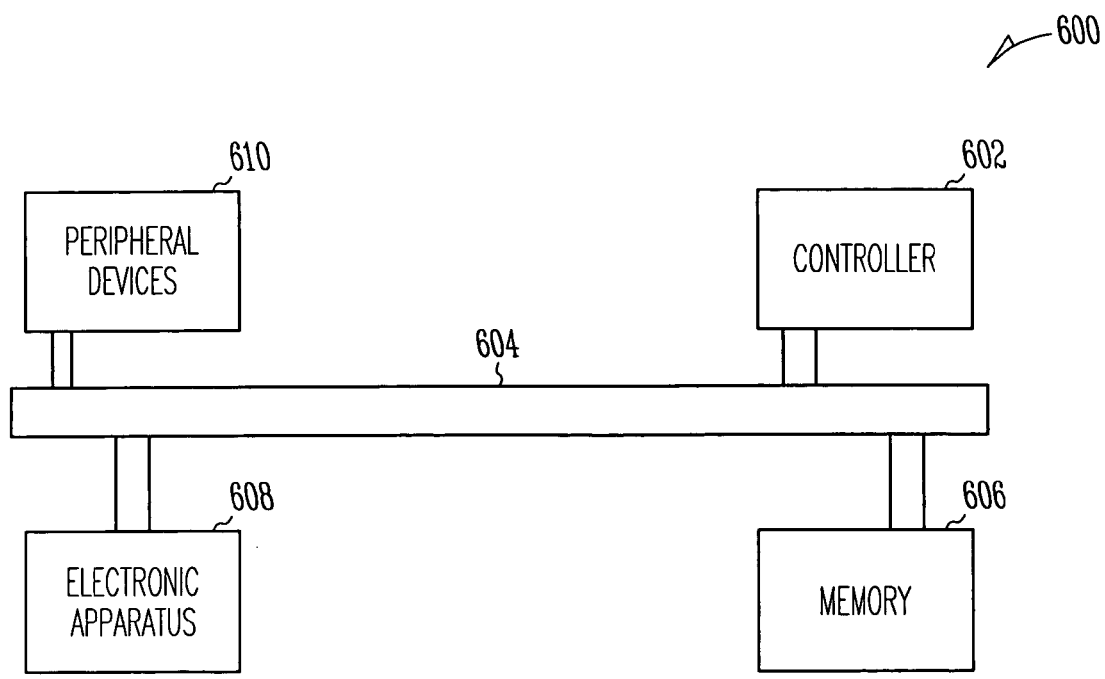
FIG. 6 is a diagram of an electronic system having devices in accordance with an embodiment of the invention.

FIG. 6 depicts a diagram of an embodiment of a system 600 having a controller 602 and a memory 606. Controller 602 and/or memory 606 include a portion of the circuit having IC devices and memory chips characterized and/or repaired in accordance with the disclosed embodiments. System 600 also includes an electronic apparatus 608, and a bus 604, where bus 604 may provide electrical conductivity and data transmission between controller 602 and electronic apparatus 608, and between controller 602 and memory 606. Bus 604 may include an address, a data bus, and a control bus, each independently configured. Bus 604 also uses common conductive lines for providing address, data, and/or control, the use of which may be regulated by controller 602. In an embodiment, electronic apparatus 608 includes additional memory devices configured similarly to memory 606. An embodiment includes an additional peripheral device or devices 610 coupled to bus 604. In an embodiment, controller 602 is a processor. Any of controller 602, memory 606, bus 604, electronic apparatus 608, and peripheral device or devices 610 may include ICs treated in accordance with the disclosed embodiments. System 600 may include, but is not limited to, information handling devices, telecommunication systems, and computers. Peripheral devices 610 may include displays, additional memory, or other control devices operating with controller 602 and/or memory 606.

CONCLUSION

A method is presented for IC problem diagnosis by positioning the sample structure in a vacuum chamber, and creating a layer of a reactive material either on or in proximity with the surface of the IC. The layer of reactive material is excited to form chemical radicals, which remove a portion of the surface of the structure by chemical etching until the desired layer is reached, or the structure is exposed. The material removed from the surface may also be analyzed to characterize the material in various ways. With such an arrangement, the various structures in an IC chip may be exposed, undercut and prepared for testing of the layer properties. The method may also be used to form localized depositions of dielectric or conductive materials.

The reactive material may comprise various types of halogen in gaseous, liquid or solid form. In an embodiment, the reactive material is xenon fluoride, which is a solid at standard temperature and pressure, and sublimes in the vacuum chamber. The reactive material may be directed to the region near the surface of the IC chip by a formed jet of vapor or may simply be allowed to diffuse through the vacuum chamber. The reactive material may be adsorbed onto the surface of the material, may be a gas in the vicinity of the surface, or may condense or precipitate onto the surface. The reactive material may be a mixture of materials (that is chemical precursors) which react with one another, especially when activated or excited to form chemical radicals, and may include a material that does not directly interact with the other reactive materials, but rather acts as a reaction catalyst, an inhibitor, promoter, or reaction buffer. The chemical radicals may form a chemical etching environment that may selectively remove one component of the material to be characterized, and the precursor reactive materials may be changed as the process continues and as different materials are uncovered on the IC.

The method of exciting the layer of reactive materials may use an energetic beam such as an electron beam. The electron beam may have a diameter of about $0.1\mu$, or may be less than $0.01\mu$, or greater than $1.0\mu$, depending upon the size of the area that is to be deconstructed. Preferably, the electron beam diameter is $0.005\mu$, and the area of excited reactive materials is formed by scanning the beam over the desired area. The electron beam may have a lower energy or beam intensity to slow the etch rate to improve etch control, or may be defocused to etch a wider area. The electron beam may be scanned to cover the desired etch area or etch shape. The etch areas may be made as small as the electron beam can focus, plus the mean free path of the generated chemical radicals, and may have a diameter of less than $1.0\mu$. The electron beam may be part of a scanning electron microscope (SEM), and the SEM may be used to provide an image of the process as etching occurs.

The surface material removed by the chemical radicals may be analyzed by well known analytical methods, including downstream analysis systems such as residual gas analyzer (RGA), mass spectroscopy, optical emission spectroscopy, atomic absorption spectroscopy, infrared spectroscopy, Raman spectroscopy. The surface may be direct spot analyzed by various methods such as energy dispersive analysis of X-rays (EDAX), XES, or other SEM based analytic methods. This analysis may continue while the etch process is occurring to provide a material characterization versus depth analysis. Such analysis of removed material may assist in determining when the desired layer has been substantially removed, and may thus serve as an etch stop indicator, as well as indicating when an unexpected material is present.

The material to be etched may be selected by choosing a chemical radical that preferentially etches one material faster than other materials, such as fluorine radicals etch silicon oxides and glasses at a much higher rate than they etch metals or organic materials. By using a radical chemistry that has a high etch ratio for oxides, it is possible to substantially completely remove a glass layer surrounding a trench capacitor without harming the metal plates of the capacitor or the dielectric layer. In such a manner, a device such as a trench capacitor may be examined on an IC, and various tests may be preformed on the capacitor, such as undercutting and adhesion tests.

In an embodiment, the vacuum chamber and electron beam are a part of a scanning electron microscope (SEM), and the etching may be observed by means of the SEM. In such an arrangement, the dielectric over a series of metal to metal contacts may be etched away, thus exposing at least one portion of the metal. The electron beam of the SEM may then be used to charge the entire string of metal to metal connections, and the SEM voltage contrast mode may be used to observe which of the contact string have badly opened or highly resistive contacts.

In an embodiment, the etching of a dielectric layer may be observed as the etching continues, or during short duration breaks between etch cycles, to determine if artifacts in the dielectric layer are surface scratches, such as those commonly seen after a dielectric layer has been planarized by means of chemical mechanical polishing (CMP), or whether the surface artifacts are cracks in the dielectric layer, such as may be caused by thermal stress in various types of brittle protective glass layers, such as boron-phosphorus silicate glass (BPSG).

Another illustrative embodiment of the invention includes a system for localized accelerated chemical etching, including a vacuum chamber and a fixture for positioning a sample, a system, such as a gas inlet jet, for creating a layer of a chemical proximate to the surface of the sample. An energetic beam, such as an electron beam from a SEM, is directed at the surface of the sample to form chemical radicals in the chemical, such as xenon difluoride, which may etch the sample in the region around the site of the energetic beam. The removed material may be analyzed to determine both the composition of the surface of the sample, and as etching continues to a desired depth. The depth may be observed during the etch process by the SEM or other imaging device, and the composition of contaminants may be determined by the analysis device. Areas smaller than one micron in diameter may be etched to expose various process layers, which may then be examined for proper processing, such as appropriate slope of reflowed dielectric layers, or beveled edges on contact openings.

The described embodiments are directed towards the use of an electron beam to activate an adsorbed material forming a layer on an IC chip, and forming chemical radicals to etch the surface material of the IC, but the embodiments of the invention are not so limited, and may be applied to other structures and devices, such as printed circuit boards (PCBs), multi-chip modules MCMs), liquid crystal display (LCD) devices, electronic displays, micro-electromechanical devices (MEMs), or other manufactured electronic or mechanical devices requiring failure analysis testing and material identification. Other means of forming local chemical radicals other than electron beams are included in this disclosure, to include focused microwave beams, laser and maser beams, X-ray and other energetic radiation sources. The material used to form the chemical radicals may be a gas, an evaporated liquid, a sublimed solid, or may be chemically formed by mixing precursor materials at the surface of the structure to be analyzed, or mixed remotely from the surface and either passively or actively transported to the region around the surface of the IC, or other structure. The reactive material may be either adsorbed onto the surface, precipitated onto the surface, or form a fluid layer in proximity to the surface, including a gaseous layer in the region around the IC surface. The generated chemical radicals may be used to selectively etch the surface as described in the described embodiments, or may react with other provided, or already present materials, to form dielectric, conductive or other materials to become a local deposition reaction. Such depositions may be used to refill the previously etched region to return the IC to working condition.

Although specific embodiments have been illustrated and described herein, it will be appreciated by those of ordinary skill in the art that any arrangement that is calculated to achieve the same purpose may be substituted for the specific embodiments disclosed, described and shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present disclosure includes any other applications in which embodiments of the above structures and fabrication methods are used. The scope of the embodiments of the present invention should be determined with reference to the appended claims, along with the full scope of equivalents to which such claims are entitled.

What is claimed is:

1. A method of diagnosing a problem in a structure, comprising:
    positioning an integrated circuit having a structure to be evaluated in a vacuum chamber;
    creating a layer of a reactive material a selected distance above and in proximity with a surface of the integrated circuit;
    exciting a portion of the layer of reactive material a selected distance above and in proximity to the structure to be evaluated to form chemical radicals above and in proximity to the surface of the structure to be evaluated;
    removing a portion of the surface of the integrated circuit in proximity to the structure to be evaluated to a selected level to evaluate an exposed electrical structure of the integrated circuit; and
    continuing the creating, exciting and removing steps until a stop criterion occurs,
    wherein the exposed electrical structure is evaluated to determine the presence or absence of a potential problem by at least one of a shear strength test, a vibration test, a turbulence test, a tilt test, an adhesion test, a thermal cycle test, an environmental test, and an electrical test.

2. The method of claim 1, wherein the removing a portion of the surface includes etching at least one dielectric layer surrounding an electrical structure on the integrated circuit to expose at least a top side and a plurality of lateral sides.

3. The method of claim 1, wherein the removing a portion of the surface includes etching at least one dielectric layer and evaluating the depth of cracks in at least one dielectric layer.

4. The method of claim 3, wherein the etching of the at least one dielectric layer ends when the depth of the cracks is less than the thickness of the at least one dielectric layer, and removed portion of the at least one dielectric layer is locally filled by a local deposition of a dielectric material formed by exciting a second reactive material in proximity with the surface of the integrated circuit.

5. The method of claim 1, wherein the removing a portion of the surface includes etching at least one dielectric layer and stopping the etching at a surface of a conductive material layer.

6. The method of claim 5, wherein the reactive material is removed from the proximity of the surface of the integrated circuit, and an electron beam having a predetermined energy, dwell time and current density is incident upon the conductive material layer exposed by the etching.

7. The method of claim 6, wherein the conductive material exposed by the etching is a portion of a plurality of conductive objects electrically interconnected by contact holes and is electrically charged to a predetermined level by the incident electron beam.

8. The method of claim 7, wherein electrical conductivity of the conductive material and the contact holes is determined.

9. The method of claim 8, wherein a scanning electron microscope is used to determine the electrical conductivity of each one of the plurality of conductive objects and contact holes.

10. The method of claim 1, wherein a stop criterion includes a scanning electron microscope image indicating that the structure to be evaluated is exposed.

11. The method of claim 10, wherein the reactive material comprises a halogen.

12. The method of claim 11, wherein the reactive material is xenon fluoride.

13. The method of claim 10, wherein the reactive material is a gas.

14. The method of claim 10, wherein the reactive material is a mixture of materials capable of reacting with one another.

15. The method of claim 14, wherein the mixture of reactive materials includes at least one material that does not directly interact with the other reactive materials.

16. The method of claim 10, wherein exciting the layer of reactive materials comprises an electron beam.

17. The method of claim 16, wherein an area containing the chemical radicals has a diameter of less than $1.0\mu$.

18. The method of claim 17, wherein the radicals comprise a chemical etching environment disposed to remove at least one component of the material to be characterized.

19. The method of claim 18, wherein the reactive material is changed as the chemical etching occurs to selectively remove different components of the material to be characterized.

20. The method of claim 1, wherein a stop criterion includes analyzing the material removed from the surface and ending the creating a layer of reactive material in proximity to the surface when a change occurs in a composition of the material removed from the surface.

21. The method of claim 20, wherein analyzing the material removed from the surface includes at least one of residual gas analysis, mass spectroscopy, optical emission spectroscopy, atomic absorption spectroscopy, infrared spectroscopy and Raman spectroscopy.

22. The method of claim 21, wherein the material analysis continues as the chemical radicals etch into the surface of the material to produce a material characterization versus depth analysis.

23. The method of claim 1, wherein the exciting the layer of reactive material to form chemical radicals includes an electron beam incident on the surface of the integrated circuit.

24. The method of claim 23, wherein the electron beam comprises a portion of a scanning electron microscope disposed to provide an image of the integrated circuit surface during the removing a portion of the surface.

25. The method of claim 1, wherein a vacuum pressure of the vacuum chamber is determined by a desired mean free path of the chemical radicals generated by the exciting the layer of reactive material in proximity to the surface.

26. The method of claim 1, wherein the reactive material is changed as the chemical etching occurs to selectively remove different components of the integrated circuit.

27. The method of claim 26, wherein the reactive material is changed from an etching radical to a combination of reactive materials forming a deposition radical mixture.

28. The method of claim 27, wherein the deposition radical mixture comprises at least one of silane, dichlorosilane, trichlorosilane, silicon tetrachloride, oxygen, water vapor, hydrogen peroxide and nitrous oxide.

29. The method of claim 27, wherein the etched region is at least partially filled by a dielectric layer.

\* \* \* \* \*